United States Patent [19]

Goto

[11] Patent Number: 4,490,680
[45] Date of Patent: Dec. 25, 1984

[54] INTEGRABLE QUADRATURE FM DEMODULATOR USING FEWER SIGNAL PINS

[75] Inventor: Kuniaki Goto, Yokohama, Japan
[73] Assignee: Tokyo Shibaura Denki Kabushiki Kaisha, Japan
[21] Appl. No.: 370,630
[22] Filed: Apr. 22, 1982

[30] Foreign Application Priority Data
Apr. 27, 1981 [JP] Japan .................................. 56-63838

[51] Int. Cl.³ .............................................. H03D 3/06
[52] U.S. Cl. .................................... 329/117; 329/118; 329/137; 329/140; 329/145; 455/214; 455/337
[58] Field of Search ............... 329/117, 118, 137, 140, 329/145; 455/214, 337

[56] References Cited

U.S. PATENT DOCUMENTS

3,997,856 12/1976 Canning et al. ................. 329/140 X
4,119,919 10/1978 Sugawara ........................ 329/145 X
4,144,501 3/1979 Togawa et al. ..................... 329/118

FOREIGN PATENT DOCUMENTS

26905 2/1982 Japan .................................... 329/117

OTHER PUBLICATIONS

"Toshiba Integrated Circuits Data Book", Tokyo Shibaura Electric Co., Ltd. (Dec. 1977), pp. 87-99.

Primary Examiner—Siegfried H. Grimm
Assistant Examiner—David C. Mis
Attorney, Agent, or Firm—Finnegan, Henderson, Farabow, Garrett & Dunner

[57] ABSTRACT

A quadrature type FM demodulator device used, for example, in a television receiver, includes a band pass filter for filtering a sound intermediate frequency (SIF) signal input to the device. The output of the band pass filter is coupled through a filter circuit to an integrated circuit having a limiter amplifier and an FM detector to output a sound signal from the SIF signal.

9 Claims, 5 Drawing Figures

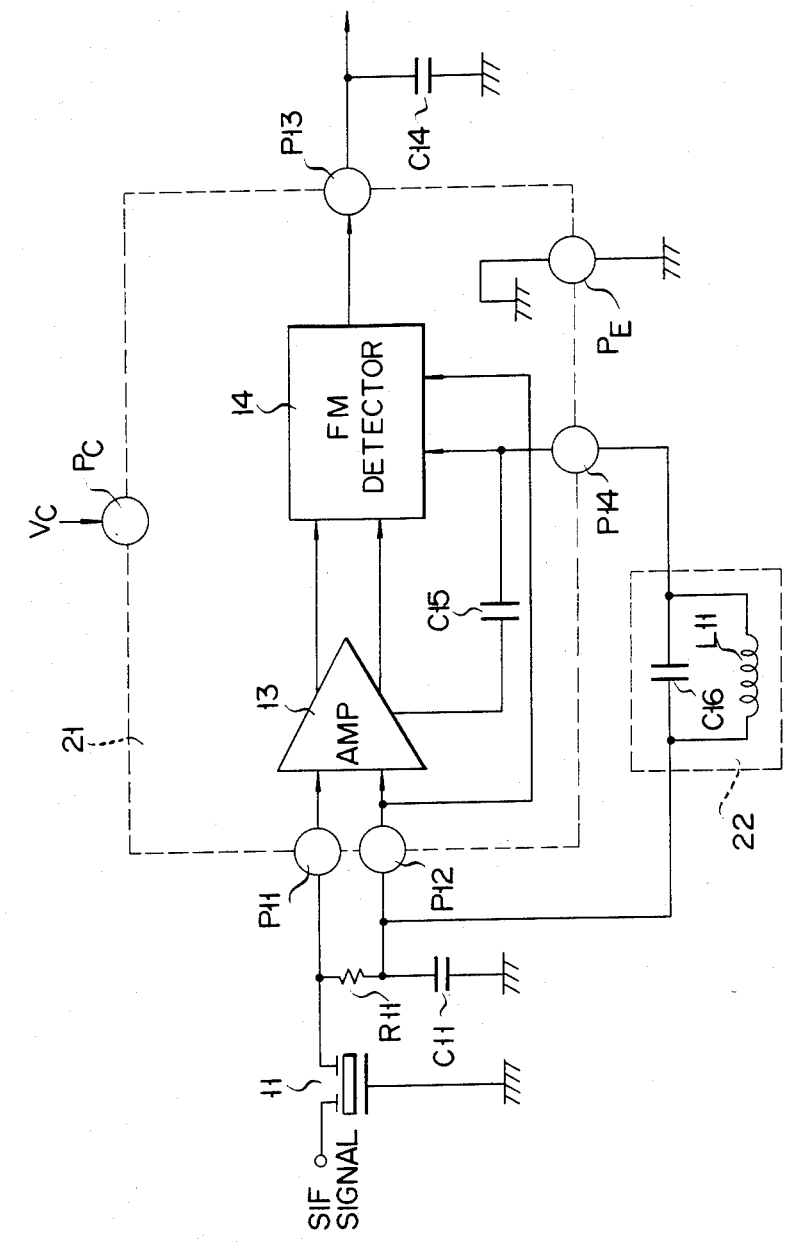

INTEGRABLE QUADRATURE FM DEMODULATOR USING FEWER SIGNAL PINS

BACKGROUND OF THE INVENTION

The present invention relates to a quadrature type FM demodulator for outputting sound signals in use for a television receiver.

In FIG. 1 illustrating a prior phase detector device of this type, a filter 1 such as a ceramic filter is a band-pass filter of 4.5 MHz. A frequency modulated sound intermediate frequency (SIF) signal of 4.5 MHz is applied to the input of the filter 1. A series circuit of a bias resistor R1 and a bypass capacitor C1 is connected in parallel with the ceramic filter 1 at the output of the filter 1. A sound intermediate frequency integrated circuit (SIF-IC) designated by reference numeral 2 has two power source pins $P_C$ and $P_E$ and six signal pins P1, P2, P3, P4, P5 and P6. The SIF-IC 2 is comprised of an SIF limiter amplifier 3 including a plurality of differential amplifiers (not shown), and a phase discriminating type frequency modulation (FM) detector 4 including a double balance type differential amplifier. A series resistor circuit including two resistors R2 and R3 is connected between the signal pin P6 and ground. A capacitor C2 is connected between the signal pin P4 and a junction between the resistors R2 and R3. The coil L1, an inductance element, is connected between the signal pins P4 and P5. The capacitor C2 and the coil L1 cooperate to form a tuning circuit, i.e., resonance circuit 6 tuning to the sound carrier signal. The series resistor circuit 5 including the resistors R2 and R3 and the tuning circuit 6 including the capacitor C2 and the coil L1 cooperate to form a phase shifting circuit. A bypass capacitor C3 is connected between the signal pin P5 and ground. A capacitor C4 for deemphasis is connected between the signal pin P3 and ground.

In the FM demodulator device in FIG. 1, an SIF signal input is amplified by the limiter amplifier 3. An amplitude-modulated (AM) component is removed by the limited amplifier 3. The output signal of the limiter amplifier 3 is directly applied to a first input terminal of the FM detector 4. The output signal of the limiter amplifier 3 is also applied to the second input terminal of the detector 4 via a phase shifting circuit made up of the series circuit having the resistors R2 and R3 and the resonance circuit 6 having the capacitor C2 and the coil L1. The phase shifting circuit shift the phase of the output signal of the limiter amplifier 3 by 90°. Therefore, the signal inputted to the second input terminal of the FM detector 4 (i.e. the phase shifted signal input terminal) is phase-shifted by 90° from the signal inputted to the first input signal. Through this phase shift, the quadrature detection is executed by the FM detector 4 so that the sound signal is output from the third signal pin P3.

However, in the prior art phase detector devices, a number of signal pins (six pins in the above example) are required. This provides many technical restrictions in the process of its fabrication. For example, the sound signal detector needs one IC chip. This causes the manufacturing cost of the device to be quite high.

SUMMARY OF THE INVENTION

Accordingly, an object of the present invention is to provide a quadrature type FM demodulator device for detecting sound signals which requires a small number of signal pins for the sound intermediate frequency integrated circuit.

It is another object of the present invention to provide a quadrature type FM demodulator device which can be easily fabricated.

It is yet another object of this invention to provide a quadrature type FM demodulator which can be manufactured at a lower cost than the prior art devices.

According to the present invention, there is provided a quadrature type FM demodulator device for outputting a sound signal comprising a 4.5 MHz band-pass filter means to which a sound intermediate frequency signal is inputted, a series R-C circuit including bias resistor means and bypass capacitor means, which is connected in parallel to the output of the filter means, a sound intermediate frequency signal integrated circuit, and a resonance circuit for tuning to a sound carrier signal.

The sound intermediate frequency signal integrated circuit includes a first power source pin impressed with a first potential, a second power source pin impressed with a second potential, and first, second, third and fourth signal pins. The first signal pin is connected to an output terminal of the filter means and the second signal pin is connected to a junction of the resistor means and the capacitor means. The integrated circuit further includes a sound intermediate frequency limiter amplifier means of the phase discriminating type of which the input terminals are respectively connected to the first and second signal pins, a frequency modulation detector of which a first input terminal is directly connected to an output terminal of the limiter amplifier means for receiving an output signal of the amplifier means, of which a second input terminal is connected to the fourth signal pin and receives a signal phase-shifted by 90° from the output signal of the amplifier means, and of which an output terminal is connected to the third signal pin where an output sound signal is provided, and the phase shifting capacitor means of which one end is connected to the output terminal of the limiter amplifier so as to receive its output signal and the other end is connected to the fourth signal pin. The resonance circuit is connected between the second signal pin and the fourth signal pin.

BRIEF DESCRIPTION OF THE DRAWINGS

FIG. 2 is a circuit diagram of an embodiment of a quadrature type FM demodulator device according to the present invention;

DETAILED DESCRIPTION OF THE PREFERRED EMBODIMENTS

Referring now to FIG. 2, there is shown an embodiment of a quadrature type FM demodulator device according to the present invention. An SIF signal is applied to the input terminal of a 4.5 MHz band-pass filter 11 such as a ceramic filter. A series circuit including a resistor R11 and a capacitor C11 is provided between the output terminal of the filter 11 and ground. The resistor R11 provides a bias voltage to a limiter amplifier 13. The capacitor C11 bypasses a high frequency carrier signal. An SIF-IC 21 has two power source pins $P_C$ and $P_E$ and first, second, third and fourth signal pins P11, P12, P13 and P14. The SIF-IC 21 comprises the limiter amplifier 13 including a plurality of SIF differential amplifiers (not shown), a phase discriminating type FM detector 14 including a double balance type differential amplifier and a phase shifting capacitor C15. In the SIF-IC 21, a first input terminal of the SIF limiter amplifier 13 is connected to the first signal pin P11, while a second input terminal of the SIF limiter amplifier 13 is connected to the second signal pin P12. An output terminal of the SIF limiter amplifier 13 is directly connected to a first input terminal of the FM detector 14. The output terminal of the SIF limiter amplifier 13 is also connected to a second input terminal (i.e. a phase shifted signal input terminal) of the FM detector 14 via the phase shifting capacitor C15. The capacitor C15 shifts the phase of an output signal of the amplifier 13 by 90°. The second input terminal of the FM detector 14 is coupled to the fourth signal pin P14. An output terminal of the FM detector 14 is connected to the third signal pin P13. A positive potential $V_C$, for example, is applied to the power source pin $P_C$. A low or ground potential is applied to the power source pin $P_E$. The resistor R11 is connected at both ends to the first and second signal pins P11 and P12.

A parallel resonance circuit 22 is made up of a capacitor C16 and a coil L11 as an inductance element which are connected in parallel. The resonance circuit 22 tunes to a sound carrier signal. The resonance circuit 22 is installed on the outside of the SIF-IC 21, being coupled between the signal pins P12 and P14 of the SIF-IC 21. A deemphasizing capacitor C14 is provided between the third signal pin P13 and ground.

Figure 3:
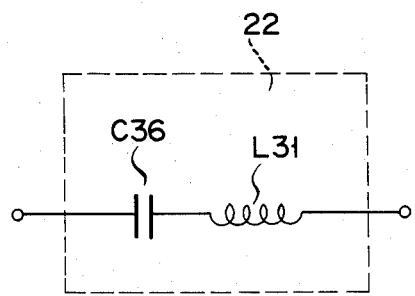
FIG. 3 is a circuit diagram of another example of the resonance circuit used in the phase detector device shown in FIG. 2.

The resonance circuit 22 is not limited to the parallel resonance circuit as shown in FIG. 2, but it may be any circuit if it can tune to the sound carrier signal. For example, a series resonance circuit 22 comprised of a capacitor C36 and a coil L31 which are connected in series as shown in FIG. 3, may be used for the same purpose.

Figure 4:
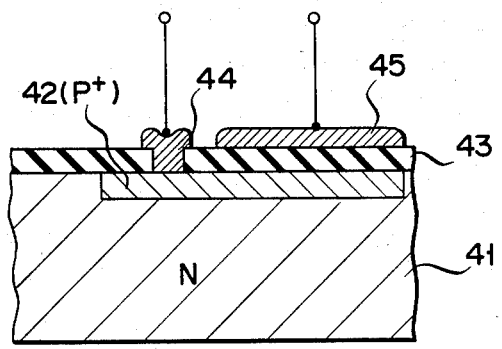
FIG. 4 is a partial cross sectional view of an example of the structure of the phase shifting capacitor used in the phase detector device in FIG. 2.

The phase shifting capacitor C15 may be a MOS capacitor arranged as shown in FIG. 4. As shown, a region 42 of P+ conductivity type is formed in a silicon substrate 41 of N conductivity type, for example. An insulation film 43 made of SiO$_2$, for example, with a contact hole is formed on the silicon substrate 41. A contacting electrode 44 made of aluminum, for example, is formed in the contact hole and contacts the P+ region 42. Another electrode 45 is formed on the insulation film 43 apart from the contacting electrode 44. With such a structure, a MOS capacitor is formed by the electrode 44, the P+ region 42, the insulation region 43 and the electrode 45.

In the phase detector device with an arrangement as shown in FIG. 2, the SIF signal is amplified and its AM component is removed in the limiter amplifier 13. The output signal of the limiter amplifier 13 is directly applied to the first input terminal of the FM detector 14. The output signal of the limiter amplifier 13 is also applied to the second input terminal of the FM detector 14 (i.e. the phase shifted signal input terminal) through the phase shifting capacitor C15. The input signal applied to the phase shifted signal input terminal of the FM detector 14 is phase-shifted by 90° with respect to the input signal applied to the first input terminal of the FM detector 14 by the phase shifting capacitor C15. The phase shifted signal inputted to the second input terminal of the FM detector 14 is also applied to one terminal of the parallel resonance circuit 22 through the signal pin P14, and the other terminal of the resonance circuit 22 is grounded in an AC mode, so that the sound carrier signal tuned by the resonance circuit 22 is obtained at the signal pin P14. In this case, the phase of the signal at the signal pin P14 is shifted by 90° from that of the signal directly applied to the first input terminal of the FM detector 14 by the function of the phase shifting capacitor C15. Accordingly, the quadrature detection is performed by the FM detector 14 so that the sound signal is produced at the signal pin P13.

As seen from the foregoing description, in the detector device of the present embodiment, the phase shifting capacitor C15 for leading the output signal from the limiter amplifier 13 to the phase shifted signal input terminal of the FM detector 14 is formed in the SIF-IC 21. The parallel resonance circuit 22 formed outside the SIF-IC 21, for tuning to the sound carrier signal, is inserted between the signal pin P14 and the signal pin P12 connected to the AC-grounded input terminal of the limiter amplifier 13. With this arrangement, the sound carrier signal phase-shifted by 90° from the sound carrier signal input to the first input terminal of the FM detector 14 is input to the phase shifted signal input terminal of the FM detector 14, thereby executing the quadrature detection in the FM detector 14. In this way, the sound signal is obtained at the signal pin P13.

The embodiment needs two power source pins $P_C$ and $P_E$, like the conventional device. It has only four signal pins, i.e. two pins P11 and P12 connected to the input terminals of the limiter amplifier 13 and two pins P14 and P13 to the sound signal input and output terminals of the FM detector 14, whereas the conventional device needs six signal pins. The reduced number of signal pins makes the fabrication easy and reduces the fabrication cost.

Figure 1:
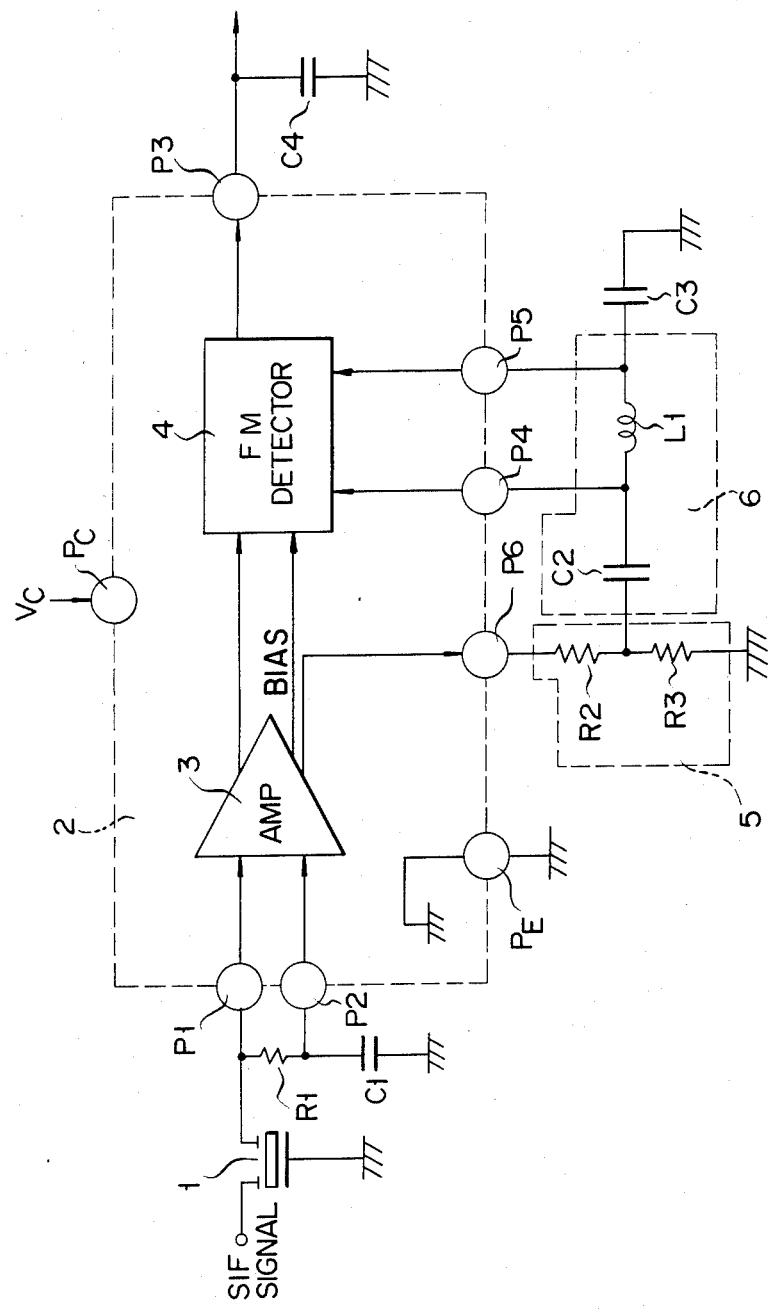
FIG. 1 shows a circuit diagram of a prior quadrature type FM demodulator device.
Figure 5:
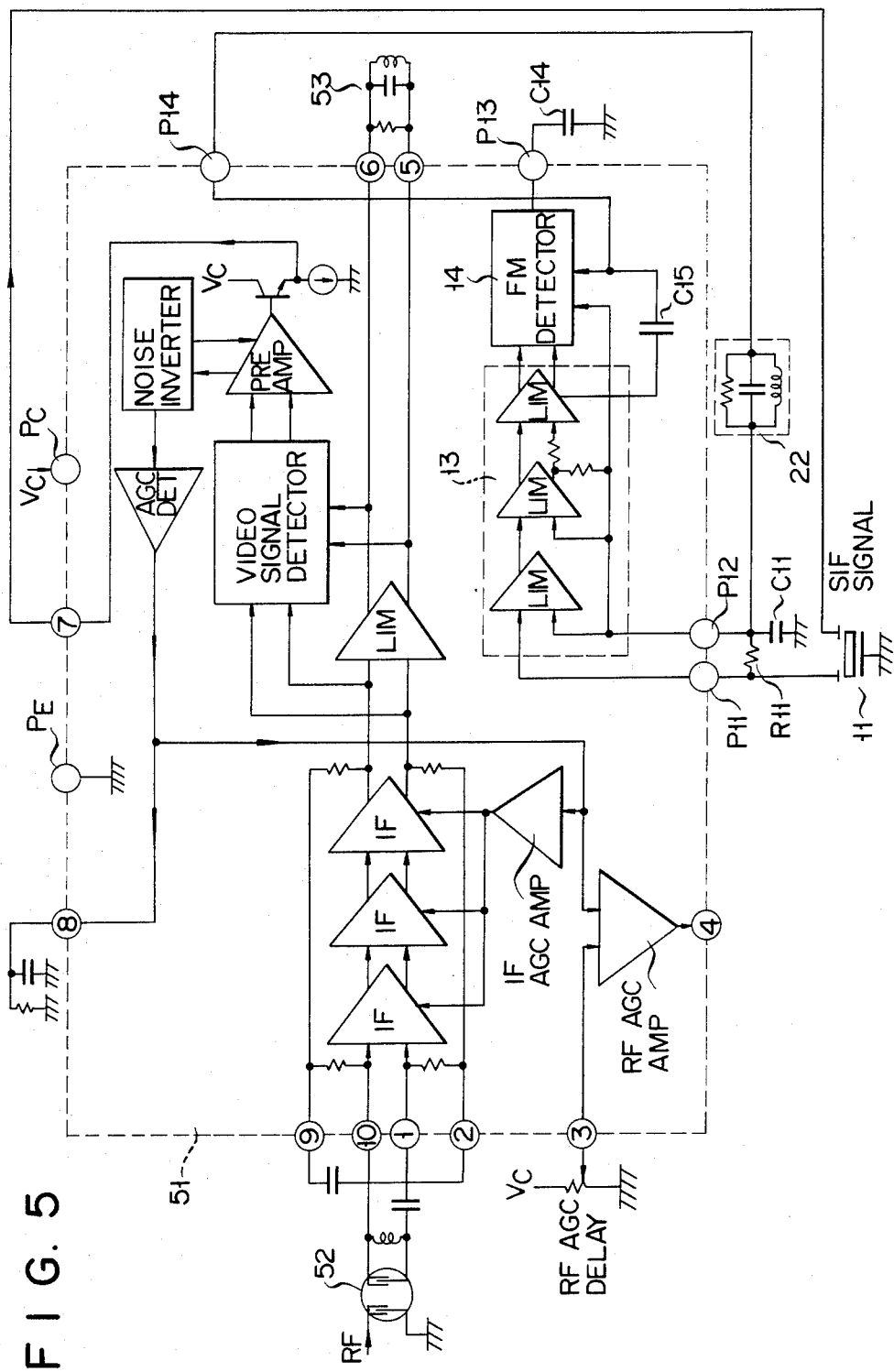
FIG. 5 is a circuit diagram of an embodiment when the present invention is applied to a television receiver.

Referring now to FIG. 5, an embodiment where the quadrature phase detecting device according to the present invention is applied to an SIF stage in an IC 51 which is used in a video intermediate frequency (VIF) stage and the SIF stage in a television receiver is shown. The IC 51 uses 16 pins in all, two power source pins $P_C$ and $P_E$, four signal pins P11 to P14 in the SIF stage, and ten signal pins ① to ⑩ of the VIF stage.

In FIG. 5, like symbols are used for designating like portions in FIG. 2. The construction and the operation principle of the VIF stage are substantially the same as those of the known device, and therefore the explanation will be omitted. After the output signal of 4.5 MHz from the signal pin 7 of the VIF stage is input to the band-pass filter 11, the signal is processed by an operation similar to that referred to in FIG. 2 to provide a sound signal at the signal pin P13. In FIG. 5, the limiter amplifier 13 comprises three limiter amplifier units LIM connected in a cascade fashion.

A surface acoustic wave (SAW) filter 52 receiving a high frequency (radio frequency) signal from the tuner (not shown) and a parallel resonance circuit 53 tuning to the video carrier signal, which partially constitute the VIF stage, are externally connected to the IC 51. These circuits 52 and 53 are well known and not essential to the present invention, and therefore no further explanation of them will be given.

As described above, according to the present invention, a phase shifting capacitor for phase-shifting the output signal from the limiter amplifier 13 by 90° and applying it to the corresponding input terminal of the FM detector 14 is provided in the SIF-IC instead of using an external phase shifting capacitor. Further, the parallel resonance circuit 22 tuning to the sound carrier signal is still provided outside the IC 21. The sound carrier signal is applied to the resonance circuit 22 from P12 which is before amplifier 13, rather than from the output of amplifier 13, and is then applied to the signal pin P14 connected to the phase shifted signal input terminal. With this arrangement, the number of necessary signal pins of the SIF-IC can be reduced to only four. As a result, the fabrication of the phase detector device is easy and its fabrication cost is reduced. Additionally, the phase detector device together with other circuit stages can be fabricated into a single IC chip.

Obviously, numerous (additional) modifications and variations of the present invention are possible in light of the above teachings. It is therefore to be understood that within the scope of the appended claims, the invention may be practiced otherwise than as specifically described herein.

What is claimed is:

1. A quadrature type frequency modulation (FM) demodulator device for outputting a sound signal based on an inputted sound intermediate frequency (SIF) signal, said device comprising:
   band-pass filter means for receiving and filtering an SIF signal;
   first circuit means coupled to an output terminal of said band-pass filter means, for causing a bias voltage;
   second circuit means coupled to said first circuit means and a first potential, for bypassing high frequency components of said SIF in the output of said band-pass filter means signal;
   sound intermediate frequency (SIF) signal circuit means including:
   a first power source input impressed with said first potential,
   a second power source input impressed with a second potential,
   first, second, third and fourth signal nodes, said first signal node being connected to said output terminal of said band-pass filter means and said second signal node being coupled to said first and second circuit means, said bias voltage being impressed between said first and second signal nodes,
   SIF limiter amplifier means having input terminals respectively coupled to said first and second signal nodes,
   phase shifting means having an input coupled to a first output of said SIF limiter amplifier means and an output coupled to said third signal node, for phase shifting the output signal from said amplifier means,
   a frequency modulation detector of the phase discriminating type having a first input terminal coupled to a second output terminal of said SIF limiter amplifier means for receiving an output signal from said amplifier means, and having a second input terminal coupled to said third signal node and the output of said phase shifting means for receiving a signal phase-shifted from the output signal of said amplifier means, and having an output terminal connected to said fourth signal mode where an output sound signal is provided; and
   third circuit means directly coupled between said second signal node and said third signal node, for tuning to a sound carrier signal, thereby providing a resonant filter for said sound carrier signal.

2. A quadrature type FM demodulator device according to claim 1, wherein said third circuit means is a parallel resonant circuit including inductor means and capacitor means connected in parallel relation.

3. A quadrature type FM demodulator device according to claim 1, wherein said third circuit means is a series resonant circuit including inductor means and capacitor means connected in series relation.

4. A quadrature type FM demodulator device according to claim 1, wherein said phase shifting means is a capacitor.

5. A quadrature type FM demodulator device according to claim 4, wherein said capacitor is a MOS capacitor.

6. A quadrature type FM demodulator device according to claim 1, wherein said band-pass filter means is a 4.5 MHz band-pass filter.

7. A quadrature type FM demodulator device according to claim 1, wherein said first circuit means includes a bias resistor coupled between said first and second signal nodes and said second circuit means includes a bypass capacitor coupled between said second signal node and said first potential.

8. A quadrature type FM demodulator device according to claim 1, wherein said sound intermediate frequency signal circuit means is an integrated circuit, said first power source input, said second power source input and said first node, second node, third node and fourth node are pins of said integrated circuit.

9. A quadrature type FM demodulator device according to claim 1, 4 or 5, wherein said phase shifting means shifts the phase of the output signal from said amplifier means by 90°.

* * * * *